United States Patent
Howe et al.

(10) Patent No.: US 12,389,578 B1
(45) Date of Patent: Aug. 12, 2025

(54) EMP HARDENED ENCLOSURE

(71) Applicant: Trachte LLC, Oregon, WI (US)

(72) Inventors: Barry Howe, Verona, WI (US); Aaron Ingham, Oregon, WI (US)

(73) Assignee: Trachte, LLC, Oregon, WI (US)

( * ) Notice: Subject to any disclaimer, the term of this patent is extended or adjusted under 35 U.S.C. 154(b) by 466 days.

(21) Appl. No.: 17/554,806

(22) Filed: Dec. 17, 2021

Related U.S. Application Data

(60) Provisional application No. 63/126,946, filed on Dec. 17, 2020.

(51) Int. Cl.
*E04H 1/00* (2006.01)
*E04H 9/10* (2006.01)
*H05K 9/00* (2006.01)
*E04B 1/92* (2006.01)

(52) U.S. Cl.
CPC ............ *H05K 9/0003* (2013.01); *E04H 9/10* (2013.01); *H05K 9/0007* (2013.01); *E04B 1/92* (2013.01); *E04B 2001/925* (2013.01)

(58) Field of Classification Search
CPC ...... H05K 9/0003; H05K 9/0007; E04H 9/10; E04B 1/92; E04B 2001/925
See application file for complete search history.

(56) References Cited

U.S. PATENT DOCUMENTS

| | | | |
|---|---|---|---|
| 3,251,159 A * | 5/1966 | Trice | E04H 9/10 52/234 |
| 9,279,265 B1 * | 3/2016 | Nead | E04H 9/10 |
| 10,765,045 B1 * | 9/2020 | Hector | H05K 9/0003 |
| 11,026,359 B1 * | 6/2021 | Fontaine | B32B 15/08 |
| 11,479,967 B1 * | 10/2022 | Ford | E04C 2/46 |
| 2014/0008119 A1 * | 1/2014 | Brandt | H05K 9/0007 174/382 |
| 2018/0347184 A1 * | 12/2018 | Caron-Fellens | B32B 5/028 |
| 2019/0029147 A1 * | 1/2019 | Cordes | B32B 15/085 |
| 2019/0032392 A1 * | 1/2019 | Cordes | F41H 5/013 |
| 2019/0063098 A1 * | 2/2019 | Cordes | E04H 9/10 |
| 2019/0124800 A1 * | 4/2019 | Bodi | E04C 2/292 |
| 2019/0269045 A1 * | 8/2019 | Carroll | E04F 15/02016 |
| 2021/0161035 A1 * | 5/2021 | Nguyen | E04B 1/04 |
| 2021/0282303 A1 * | 9/2021 | Sadler | H05K 9/0003 |
| 2023/0056117 A1 * | 2/2023 | Zlataric | H05K 9/0003 |

* cited by examiner

Primary Examiner — Basil S Katcheves
(74) Attorney, Agent, or Firm — Quarles & Brady LLP

(57) ABSTRACT

An enclosure to protect people and instruments from the effects of an electromagnetic pulse (EMP) is provided. The enclosure includes a floor assembly; walls extending upward on a first, second, third, and fourth side of the floor assembly; a roof; and a ceiling. On the interior of the enclosure, a shield layer is provided such that the enclosure forms a six-sided Faraday cage. Fasteners and other conductive securement materials such as copper tape help achieve the conductivity of the shield layer. Extending through the walls of the enclosure may be secure points of entry allowing for people, air, and conductors to securely enter and exit the enclosure. The enclosure contains a grounding system to assist with protecting the contents of the enclosure from the effects of the EMP.

20 Claims, 16 Drawing Sheets

EMP HARDENED ENCLOSURE

CROSS-REFERENCE(S) TO RELATED APPLICATION(S)

This present application claims priority on U.S. Provisional Patent Application Ser. No. 63/126,946, filed on Dec. 17, 2020 and entitled EMP Hardened Enclosure, the entire contents of which are hereby expressly incorporated by reference into the present application.

BACKGROUND OF THE INVENTION

The invention relates to the field of secure enclosures, such as shelters and buildings. More specifically, the invention relates to a hardened enclosure that can attenuate an electromagnetic pulse (EMP) while protecting the sensitive contents of the enclosure from the pulse.

In the evolving world of politics, the threat of an EMP (nuclear or man-made) and its potential effect on the electric power grid has recently received much attention by government officials as well as the power industry. Specifically, an EMP event is identified as a low probability/high consequence event. There are several types of EMP events that pose this threat, specifically: Nuclear ElectroMagnetic Pulse (NEMP), including High-altitude ElectroMagnetic Pulse (HEMP), Non-Nuclear EMP (NNEMP), Radio Frequency Weapons (RFW), Lightning, and plasma waves (similar to Geo-Magnetic Disturbances-GMD).

Of particular concern for electronic equipment is what is defined as an E1 wave which is the leading edge of the EMP wave. The E1 wave with which the power industry is concerned emits an electric field with a fast rise time (about 1 nsec) with significant radiated field strength—estimated at 50 kV/m. Such a pulse has been demonstrated to cause catastrophic damage to electrical and electronic equipment by either direct radiation or by coupling with conductive materials (e.g. field wiring and transmission lines) and conducting extremely high energy electrical pulses into those equipment's. Such conductive materials include metal control houses, equipment enclosures and housings, and power and signal conductors (wires and cables) entering and exiting such equipment.

There are a number of mitigation strategies available to the utility industry including hardened control house designs with highly-conductive coatings, gasketed entry ways, application of shielded cable, shielded cable entry ways, and EM filtered air intakes. Additionally, application of process bus technologies enables the optical substation where all entries into the control house are fiber optic. Devices themselves can be hardened through the application of fast high-energy absorption devices.

What is therefore needed is a hardened enclosure meant to protect the contents of the enclosure from an electromagnetic pulse. Enclosures such as this are becoming increasingly necessary as countries develop capabilities to produce electromagnetic pulses that could disrupt utility grids, especially telecommunications and electrical systems. Sheltering such sensitive equipment protects the equipment from the effects of the electromagnetic pulse and allows the equipment to remain functional. If such equipment were not protected from the electromagnetic pulse, the resulting damage to the equipment would be devastating and could result in the loss of communication or utilities for substantial amounts of time. The invention solves this problem by providing a six-sided Faraday cage that protects its contents from the effects of the electromagnetic pulse through continuous conductive connections that allow for the pulse to travel into the ground rather than through the enclosure and its contents. This protection is achieved not only by the creation of the Faraday cage, but additionally by use of a special hardened material, e.g., conductive coatings, that enhances the steel's shielding abilities and by using structural techniques, such as substantial overlap between particular components, to achieve its unique protection.

SUMMARY AND OBJECTS OF THE INVENTION

It is an object of this invention to provide an enclosure that protects all contents contained within the enclosure, including any electronic components such as computer hardware, from an electromagnetic pulse. It is a further object of the invention to readily allow for service and operation of the contents of the enclosure without compromising security.

In one embodiment of the invention, a modular electromagnetic pulse hardened enclosure is provided that includes multiple components that are shipped separately and then assembled. The enclosure includes a floor assembly having at least one floor panel supported by at least one floor joist. The enclosure also includes a plurality of wall sheets configured to be assembled into a plurality of walls that are secured to the floor assembly. Further, the enclosure includes a plurality of ceiling sheets that are configured to be assembled into a ceiling that is secured to the plurality of walls. Additionally, the enclosure includes at least one point-of-entry that extends through the plurality of walls. Further still, the enclosure includes a shield layer that has a continuous, conductive connection that extends between the floor assembly, the plurality of walls, and the ceiling. More specifically, the shield layer includes a plurality of shield layer sheets and seams that formed where adjacent shield layer sheets overlap by at least two inches. The plurality of shield layer sheets may be comprised of 26 gauge galvalume steel sheets. Additionally, the enclosure may include a plurality of strips of copper foil tape that is applied to each of the plurality of shield layer seams. The enclosure also includes a plurality of fasteners that are mounted at the plurality of shield layer seams, where the fasteners are distanced not more than six inches from adjacent fasteners. The enclosure may also include a plurality of end walls, a plurality of sidewalls, a plurality of butt joints located at the plurality of end walls and the plurality of sidewalls, and a plurality of strips of copper foil tape that are applied to the plurality of butt joints. Additionally, a splice bond may be provided that extends across a split formed in the shield layer. The enclosure may also have a plurality of bond angles having a first section and a second section, where the first section extends approximately 90 degrees relative to the second section. The first section may be secured to the floor assembly, and the second section may be secured to one of the plurality of sheets.

According to another embodiment of the invention, a method of assembling a modular electromagnetic pulse hardened enclosure is provided. The method includes the steps of transporting a plurality of enclosure sections to an assembly location; assembling an enclosure including a floor assembly, a plurality of wall sections, and a plurality of ceiling sections; and then overlapping a plurality of shield layer sheets to form a shield layer about the enclosure. The method may also include the steps of scrubbing an overlap area that is adjacent to a plurality of edges of the plurality of shield layer sheets with an abrasive pad, cleaning the overlap area with an alcohol solvent, applying at least one strip of copper tape to the overlap area, and burnishing the strip of copper tape in place. The method may further provide the step of scrubbing the overlap area of at least two inches from the plurality of edges of the plurality of shield layer sheets. Further still, the method may include the step of applying at least one strip of copper tape over a seam formed by edges of adjacent shield layer sheets. The method may also include the steps of applying a splice bond over the seam, applying another strip of copper tape over a first side of the splice bond and one of the shield layer sheets, and applying a second strip of copper tape over a second side of the splice bond and one of the shield layer sheets. Additionally, the method may include the steps of securing a first side of a bond angle to the floor assembly, securing a second side of the bond angle to the wall section. The first side of the bond angle is located at substantially 90 degrees relative to the second side of the bond angle.

In one embodiment of the invention, a building is provided that includes a floor assembly having a plurality of floor joist members that extend across a width of the building. The enclosure's floor assembly is placed on a support surface and makes contact with the support surface through base panels. The base panels are attached to the bottom of floor joist members that extend across a width of the enclosure and make up part of the floor assembly, with perimeter channels creating the outer perimeter of the floor assembly. In some embodiments, the enclosure may make contact with the support surface through the perimeter channels, with the base panels being recessed. Fork pockets may extend through the perimeter channels to assist in placing the floor assembly. Additionally, lifting lugs may extend from the perimeter channels to further assist with placement. A plurality of floor panels is attached to the top of the floor joist members to create a floor. Extending upward from the floor assembly on a first, second, third, and forth side is a wall framework including a base and top channel, a post, and a girt. A plurality of interior wall panels is secured to the interior of the wall framework creating the interior walls of the enclosure. Depending on the embodiment, the interior walls may have a liner on them for additional protection. This liner may consist of steel panels. In other embodiments, the liner may vary depending on the specific requirements of the enclosure. Additionally, in some embodiments, there may also be a barrier placed between the wall framework and interior wall panels, used to protect from the elements and other forms of penetration into the enclosure. The barrier may be a 4 mil. polyethylene vapor barrier or may be a different barrier depending on the embodiment of the enclosure. Further still, a wall insulation space may be disposed between the interior wall panels and exterior wall panels.

A plurality of exterior wall panels is secured to the exterior of the wall framework and creates the exterior walls of the enclosure. Disposed between the interior wall panels and the exterior wall panels is an insulation space. In some embodiments an insulation blanket may be utilized in this insulation space. In other embodiments a blown-in insulation may be used. In even further embodiments yet a different form of insulation or no insulation at all may be used in this insulation space. Also connected to the wall framework is a plurality of roof truss members. A panel of ceiling members is attached to the bottom of the plurality of roof truss members to create a ceiling. On top of the roof truss members and wall panels are a plurality of roof panels that make up the roof of the enclosure.

Extending around the entirely of the interior of the enclosure is a continuous conductive connection that extends between the floor, the plurality of interior wall panels, and the panel of ceiling members to create an electrically-contiguous six-sided Faraday cage. Furthermore, corner joints at the floor, walls and ceiling are electrically bonded by continuous, mechanically-fastened, conductive brackets. In some embodiments, such corner joints can also be augmented by using at least one of a conductive paste, conductive adhesive, conductive gasket, or continuous weld depending on the level of attenuation required. The resulting Faraday cage, composed of the floor, walls, and ceiling, all being mechanically bonded to each other with continuous conductive connections, is generically referred to as the shield or shield layer. The shield layer is connected to the wall framework at posts, girts, strappings, base channels, and top channels using fasteners. In some embodiments, the fasteners are spaced at a maximum spacing of six inches, but this can be more densely spaced depending on the embodiment. Additionally, for maximum efficiency in shielding against EMP, all shielding layer seams should overlap a minimum of two inches.

A metal enclosure of the intelligent electronic device (IED) components provides shielding from radiated EMP. In addition to metal shielding, an adequate grounding and ground wiring with minimum ground impedance is proposed to reduce the common mode impedance. It is to be noted that a flat braid ground wire has lower inductance than a solid copper wire and its use is a best practice in rack ground wiring. In some embodiments, this is achieved through use of special ground pads on the interior and exterior corners of the enclosure. A continuous weld conductively connects the floor to the perimeter channel at the corners to ensure a low impedance ground path from the interior ground pads to the exterior ground pads.

Extending through the exterior wall panels, the wall framework, and the interior wall panels is at least one secure point of entry. In most embodiments, the enclosure will have a door as one of its secure points of entry. However, there may be embodiments in which a door does not exist. Other secure points of entry that may be present in some embodiments include an air intake, an air exhaust, a HVAC system, and entry for conductor bulkheads. In embodiments containing a door, the door may also have a blade that is accepted into the door frame. The door frame is secured to the shield layer. In some embodiments, the door frame may have radio frequency seals of various conductive materials, including for instance but not limited to beryllium copper finger stock secured to the door frame and configured for receiving the door with a blade. In further embodiments, these blade-and-finger-stock radio frequency seals can be single or double blade configurations, with the double blade configuration providing higher attenuation levels. In other embodiments, the door may be a radio frequency and acoustic shielding door, like that disclosed in U.S. Pat. No. 9,828,798 to Lahita, also having the door frame bonded to the shield layer. U.S. Pat. No. 9,828,798 to Lahita is hereby incorporated by reference.

In embodiments where an air intake, air exhaust, or a HVAC unit are present, there is a large penetration through the shield layer, which can result in vulnerability and could allow for penetration by the EMP. This problem is addressed by a honeycomb air vent. The honeycomb vent consists of a conductive metallic frame bonded to the shield layer around the entire periphery of the penetration in the shield layer. The airway itself is comprised of numerous hexagonal or other shape cells made of a conductive material and bonded to the frame. The frame is then connected directly to the shield layer. Each cell constitutes a waveguide whose maximum aperture dimension is 1/5 or less the length of the cell. Of course, this proportion could vary, with each cell constituting a waveguide whose maximum aperture dimension is 1/3 of the length of the cell, In other embodiments, greater length/width ratios can be employed for higher levels of attenuation.

The building shield addresses the atmospheric energy field; however, for conductors (wires and cables) entering or exiting the enclosure, special provisions need to be employed to prevent both radiated energy and conducted transients from being transmitted into the enclosure along these conductors. One method employed in some embodiments is the use of shielded cables in conjunction with special conductor bulkhead feedthroughs. These feedthroughs provide environmental sealing against moisture, air, dust and insect ingress; additionally, they possess features that connect the shields on incoming cabling to the shield layer of the enclosure. This is one way to provide a low impedance path to direct conducted transients from cable shielding directly to the building shield layer.

In some embodiments, there may be a shipping split that extends through the entirety of the enclosure to help with transporting the enclosure. These shipping splits may extend lengthwise and/or width wise across the entirety of the enclosure. In some of the embodiments that contain a split, once the enclosure is put into place, a continuous electrical shield is bonded across the split in the panel of ceiling members, the floor, and the plurality of interior wall panels so that the interior of the enclosure again forms an electrically-contiguous six-sided Faraday cage. Furthermore, splice bonds extending across the ends of the split help achieve the electrical continuity of the enclosure. Even further, in some embodiments, a continuous weld may be used to further secure and conductively connect all seams and splits. In some embodiments, a conductive adhesive, conductive foil tape, conductive paste, conductive gasket or continuous weld may be used on the continuous conductive connection to further promote electrical continuity across the interior of the enclosure.

In some embodiments, a plurality of mounting arms may extend downward from the panel of ceiling members. Further, a tray is secured to the distal ends of the mounting arms and a tray cover is secured to the mounting arms atop the tray, creating a compartment between the tray and the tray cover. The compartment may be used for passing cables through the enclosure in a safe manner or for any other purpose.

Some embodiments of the invention the enclosure may consist of a five-sided building secured to a concrete slab with provisions for connecting to the conductive shield already in or on the concrete slab. In alternative embodiments, an existing building may be encapsulated on five sides with the shield layer and grounding provisions. In still other embodiments, a prefabricated enclosure may be transported to the site and secured to the support surface. In further embodiments, the enclosure may contain lengthwise and/or widthwise shipping splits across the enclosure allowing for easy transport. In these embodiments, a conductive shield may be bonded across the splits to provide additional shielding. Alternatively, in other embodiments, the enclosure may be built on-site.

Additionally, a fiberglass blanket may be disposed in a wall insulation pocket. Further still, the present invention may include an enclosure having a floor, including at least one floor panel secured to a top of an at least one floor joist, and at least one perimeter channel, creating a floor insulation pocket between the at least one floor panel, the at least one floor joist, and the at least one perimeter channel; a wall extending upward from the floor on a first, second, third, and fourth side; at least one exterior wall sheeting, secured to an exterior portion of a building framework; at least one interior wall sheeting, secured to an interior portion of a building framework; a wall liner, lining the interior wall sheeting; a wall insulation pocket created between the exterior wall sheeting and the interior wall sheeting; a ceiling, consisting of at least one panel of ceiling members, secured to an interior portion of an at least one ceiling support; a roof, consisting of at least one roof panel, secured to an exterior portion of an at least one roof truss member; at least one wall-ceiling bond between a portion of the at least one interior wall sheeting and the ceiling; at least one floor-wall bond between a portion of the at least one interior wall sheeting and the floor; wherein the at least one wall-ceiling bond and the at least one floor-wall bond forms a continuous, conductive connection connecting the floor to the walls and the walls to the ceiling, creating a shield layer.

In yet another embodiment, a method is provided for building an EMP hardened enclosure including the steps of laying a floor assembly; securing a floor to the floor assembly; erecting a wall framework; securing at least one interior panel to an interior of the wall framework; securing at least one exterior panel to an exterior of the wall framework; securing a roof to the wall framework; forming a ceiling below the roof; forming a continuous, conductive connection between the floor, the at least one interior panel, and the ceiling; and laying a grounding system.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

Disclosed herein are several of many proposed solutions to EMP problems. Not all of the disclosed solutions are appropriate for every utility or task. Care should be taken in determining whether the disclosed invention and particular embodiment is appropriate for a specific situation.

BRIEF DESCRIPTION OF THE DRAWINGS

A clear conception of the advantages and features constituting the present invention, and of the construction and operation of typical mechanisms provided with the present invention, will become more readily apparent by referring to the exemplary, and therefore non-limiting, embodiments illustrated in the drawings accompanying and forming a part of this specification, wherein like reference numerals designate the same elements in the several views, and in which.

Figure 1:
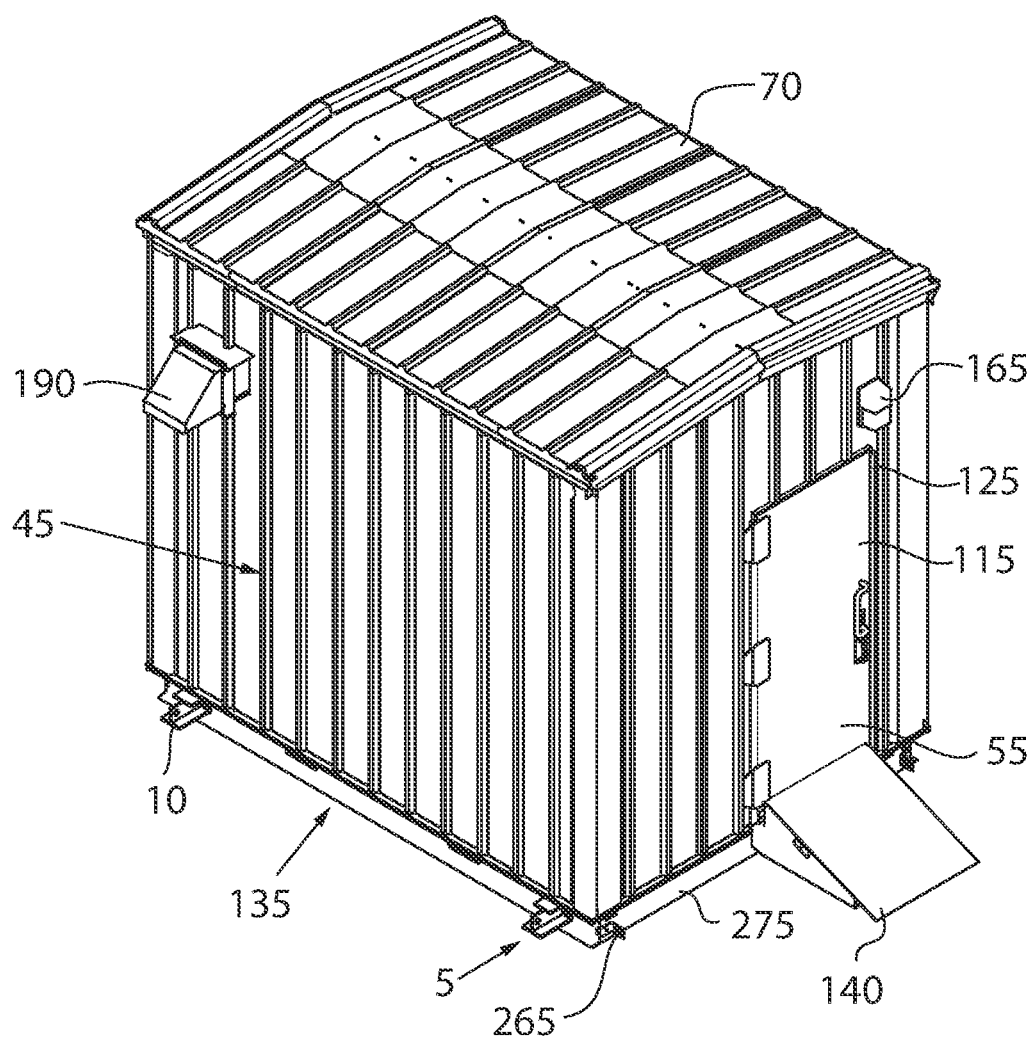
FIG. 1 is a perspective view of one embodiment of an EMP hardened enclosure of the present invention.

In describing the preferred embodiment of the invention that is illustrated in the drawings, specific terminology will be resorted to for the sake of clarity. However, it is not intended that the invention be limited to the specific terms so selected and it is to be understood that each specific term includes all technical equivalents, which operate in a similar manner to accomplish a similar purpose. For example, the word connected, attached, or terms similar thereto are often used. They are not limited to direct connection but include connection through other elements where such connection is recognized as being equivalent by those skilled in the art.

DETAILED DESCRIPTION OF THE INVENTION

The present invention and the various features and advantageous details thereof are explained more fully with reference to the non-limiting embodiments described in detail in the following description.

1. System Overview

The current invention relates an EMP hardened enclosure that is capable of withstanding various EMP events as described herein. The enclosure may be made of a number of nominal sheets, such as four-foot-by-ten-foot sheets that are affixed to one another. Of course, the sheets can come in any number of different sizes. Because of the number of sheets that would be used for a given enclosure, one result is that there are many seams where the sheets abut one another on the walls and the ceiling. In some preferred embodiments, adjacent sheets overlap at the seam by a minimum of two inches to ensure sufficient protection and support. The present invention therefore has a number of different features located at these seams. For instance, interior structural connections of the building framework may be provided that are fastened using low-profile construction rivets. In some embodiments, such rivets are preferable over "standard" hex washer head self-drilling screws because the low-profile rivets create a flat surface to which a shield layer is attached, which in turn reduces bubbling and rippling of the shield layer. Regardless of whether the low-profile rivets or other types of screws, rivets, or other fasteners are used, each fastener is preferably used at a spacing not to exceed six inches, again to help ensure sufficient protection and support. Additionally, 16 ga galvanized stiffeners may be provided at some, or more preferably all of the seams to provide a robust surface to receive seam fasteners, as well as to hold the seams flat. This also reduces the buckling/rippling of the shield material.

In a preferred embodiment, all of the seams are augmented with a multi-step process. First, an area of approximately two inches is scrubbed continuously along both sides of the seam for the entire length of the seam. This scrubbing can occur using any number of different materials, including but not limited to Scotch-brite pads, steel wool, or other similar media, in order to remove oxidization and other non-conductive contaminants. Next, the scrubbed area is cleaned using isopropyl alcohol or a similar suitable solvent. After that is completed, a continuous strip of copper foil tape with conductive adhesive is applied along the seams. The tape is preferably centered on the seam such that it adheres to the shield material continuously along both sides of the seam. The tape is a minimum of at least one inch wide, although much greater widths may be used as desired. Finally, the tape is burnished in place to ensure maximum adhesive and electrical contact are achieved.

Additionally, a shield layer electromechanically bonds across building splits. In order to preserve the functional integrity of the shield on split buildings, the building must be connected with low-impedance electrical bonds across building splits as part of the field installation of the building. These splits may be present on one or more of the endwalls, sidewalls, ceilings, and floors. This occurs for ceilings and walls by first applying a copper tape with conductive adhesive directly to the butt joint where two shield layers meet at the split. A field-installed electromechanical splice bond acts as a bridge that connects the shield layer across splits. This bridge may be flat or hat-shaped in profile, and it overlaps the shield on each side of the seam by a minimum of an inch-and-a-half. The bridge may be fastened directly to the shield using any number of mechanical fasteners, including screws, rivets, and other mechanical fasteners at a distance of no greater than six inches relative to one another.

The seam along both edges of such splice bonds are augmented with a multi-step process. First, an area of approximately two inches is scrubbed continuously along both sides of the seam for the entire length of the seam. This scrubbing can occur using any number of different materials, including but not limited to Scotch-brite pads, steel wool, or other similar media, in order to remove oxidization and other non-conductive contaminants. Next, the scrubbed area is cleaned using isopropyl alcohol or a similar suitable solvent. After that is completed, a continuous strip of copper foil tape with conductive adhesive is applied along the seams. The tape is preferably centered on the seam such that it adheres to the shield and the splice bond continuously along both sides of the seam. The tape is a minimum of at least one inch wide, although much greater widths may be used as desired. Finally, the tape is burnished in place to ensure maximum adhesive and electrical contact are achieved.

Additionally, for splits across floors, shield bonding is accomplished using a multi-step process. First, the contact faces of the floor structural members have conductive masking tape (CMT) applied at locations where removable deck plate are not present. A conductive gasket, such as TwinSeal or any other known to those having ordinary skill in the art, are applied to the CMT at these locations to create an electrical connection across the split floor. Floor seams at building splits are covered with field-installed removable deck plates made of 3/16" steel plates. Of course, other deck plates could be used having different dimensions or made of different materials. For instance, 1/4" steel deck plates could also be used. These plates are typically twenty-four inches wide by a nominal length of several feet in order to keep the plate weight and number manageable, although other plate dimensions can similarly be used. The perimeter of each plate is supported by a continuous shelf that is a minimum of one inch wide to which the CMT has been applied. Further still, the perimeter of the underside of each such plate is also treated with a continuous strip of CMT. Additionally, a conductive gasket, such as TwinSeal or any similar material as known to those having ordinary skill in the art is applied to the underside of each plate. Each plate is then fastened to the support shelf around its entire perimeter using self-drilling screws or other mechanical fasteners at a spacing of no greater than six inches between each fastener. Furthermore, copper, aluminum, or other metallic tape may be installed across the seams of the top surface of the plates after they have been installed to enhance the performance of the deck plates.

Further still, the inventive EMP hardened building design is compatible with raised "computer floors." Additionally, an EMP door mounts entirely to a wall instead of typical doors that mount to a wall on three sides and to the floor at the threshold. Also, a feedthrough flange is provided, which allows openings to be created through a shield envelope to an enclosure outside of a building without compromising the functional integrity of the shielded building.

Finally, the strategic application of copper tape with conductive adhesive significantly improves the performance of the shield design. As a result, in preferred embodiments, the Scotch-brite/Alcohol/Copper Tape method of preparing the seams that is described above is now an integral part of the shield design.

The combination of these improvements allows for an EMP hardened building that can more easily be obtained for a cheaper overall price without having to rely on welding all components.

2. Detailed Description of Preferred Embodiments

FIG. 1 illustrates a perspective view of one embodiment of an EMP hardened enclosure of the present invention. The enclosure 135 is secured to a floor assembly 5, which includes floor joist members and perimeter channel 275. Extending upward from the floor assembly 5 are the exterior wall panels 45 on all four sides of the enclosure 135. In some embodiments of the present invention, the enclosure 135 is shipped in multiple pieces and later assembled, as well further be described below.

Disposed on the sides of the enclosure and extending through the exterior wall panels may be a variety of points of entry 55. The embodiment shown in FIG. 1 contains a door 115 extending through the exterior wall panels 45. A ramp 140 may be provided and lead up to the door 115 to allow for safe and efficient access to the enclosure. The door frame 125 lines the perimeter of the door 115 and also is secured to the building framework and shield layer. Further, also extending through the exterior wall panels 45 is another point of entry 55; this is an air exhaust 190. Secured to the tops of the exterior wall panels 45 and forming the top surface of the enclosure is the roof 150 (see FIG. 4A). The roof 150 is made up of roof panels 70. Some of the materials used to build the enclosure include: steel sheets (structural steel, cold-formed steel, hot-rolled steel, etc.), copper ground pads, and galvanized pipe. Of course, other materials could be used without deviating from the present invention.

Figure 2:
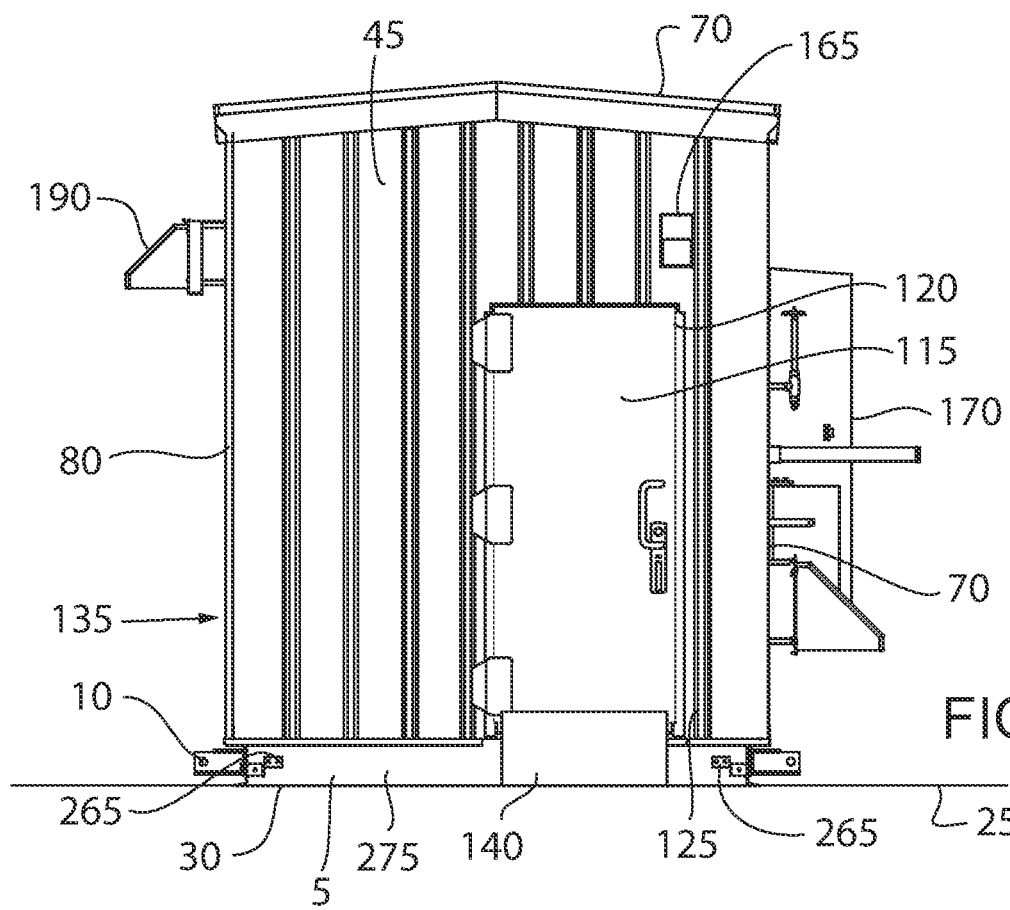
FIG. 2 is a front view of one embodiment of an EMP hardened enclosure of the present invention.

FIG. 2 illustrates a front view of one embodiment of an EMP hardened utility enclosure of the present invention. The enclosure 135 contacts the support surface 25 through the base panels 30. The base panels are connected to the bottom surface of the floor joist members 10 and begin to make up the floor assembly 5. Also part of the floor assembly 5, are the perimeter channels 275, which make up the outer perimeter of the floor assembly 5. Secured to perimeter channels 275 are exterior ground pads 265, which are connected to interior ground pads 255 (see FIG. 8) through a continuous conductive grounding connection 300 (see FIG. 8). Secured to the floor assembly 5, are the exterior wall panels 45.

Passing through the exterior wall panels 45 is a door 115. Around the door 115 is a door frame 125 secured to the shield layer 80 (see FIG. 5) and the wall framework 35 (see FIG. 5). Leading up to the door 115 is a ramp 140.

A secure exhaust 190 extends through the exterior wall panels 45 on a side of the enclosure 135 allowing for air to flow out of the enclosure. A HVAC unit 170 is secured to the exterior wall panels 45 and extends through them and the interior wall panels 40 (see FIG. 5) to communicate with the interior of the enclosure 135.

Figure 3:
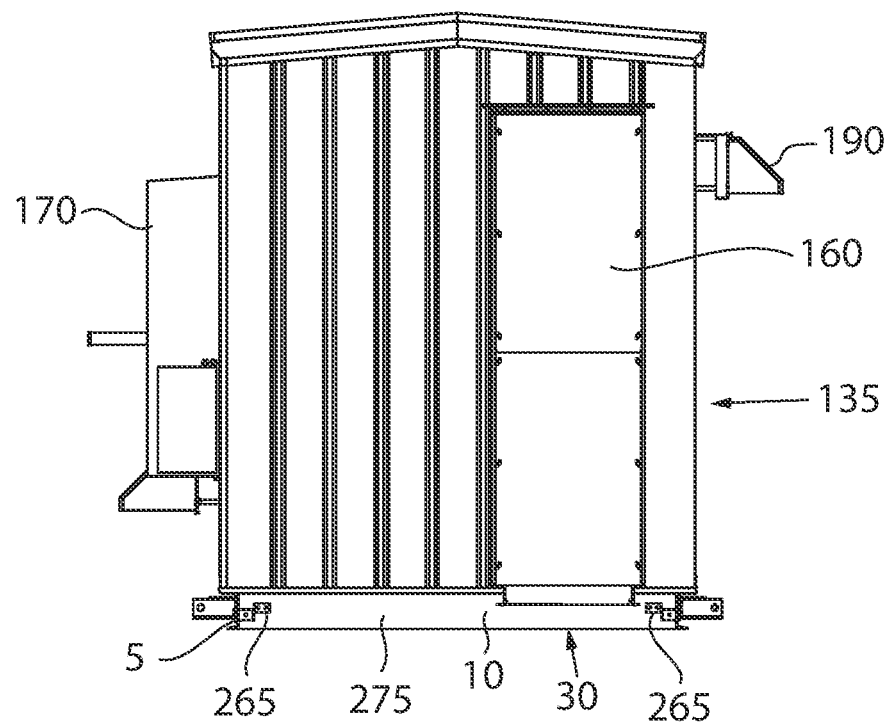
FIG. 3 is a back view of one embodiment of an EMP hardened enclosure of the present invention.

FIG. 3 illustrates a rear view of one embodiment of an EMP hardened enclosure of the present invention. Exterior wall panels 45 make up the outside surface of the walls. Secured to a portion of the exterior wall panels 45 is a cable riser 160, coming up from the floor assembly 5. The cable riser 160 may provide shielding for cables 320 (see FIG. 11) and conductors that enter and exit the enclosure 135. Further, the cable riser 160 leads to a particular point of entry 55. This is the conductor bulkhead point of entry 305 (see FIG. 11), which provides additional shielding and conducts transients to the ground. Additional points of entry 55 may exist depending on the embodiment. In the embodiment shown in FIG. 3, an HVAC unit 170 and an air exhaust 190 are secured to the exterior wall panels 45 and extend through them to the interior of the enclosure 135.

Further in FIG. 3, the floor assembly 5 contacts the support surface 25 through the base panels 30. The floor assembly 5 includes floor joist members 10 extending a length of the enclosure 135 and perimeter channels 275 lining the perimeter of the floor assembly 5. Secured to the perimeter channel 275 is an exterior ground pad 265, which connects to an internal ground pad 255 (see FIG. 8) through a continuous conductive grounding connection 300 (see FIG. 8 & FIG. 5), which helps electrically ground the enclosure 135.

Figure 4A:
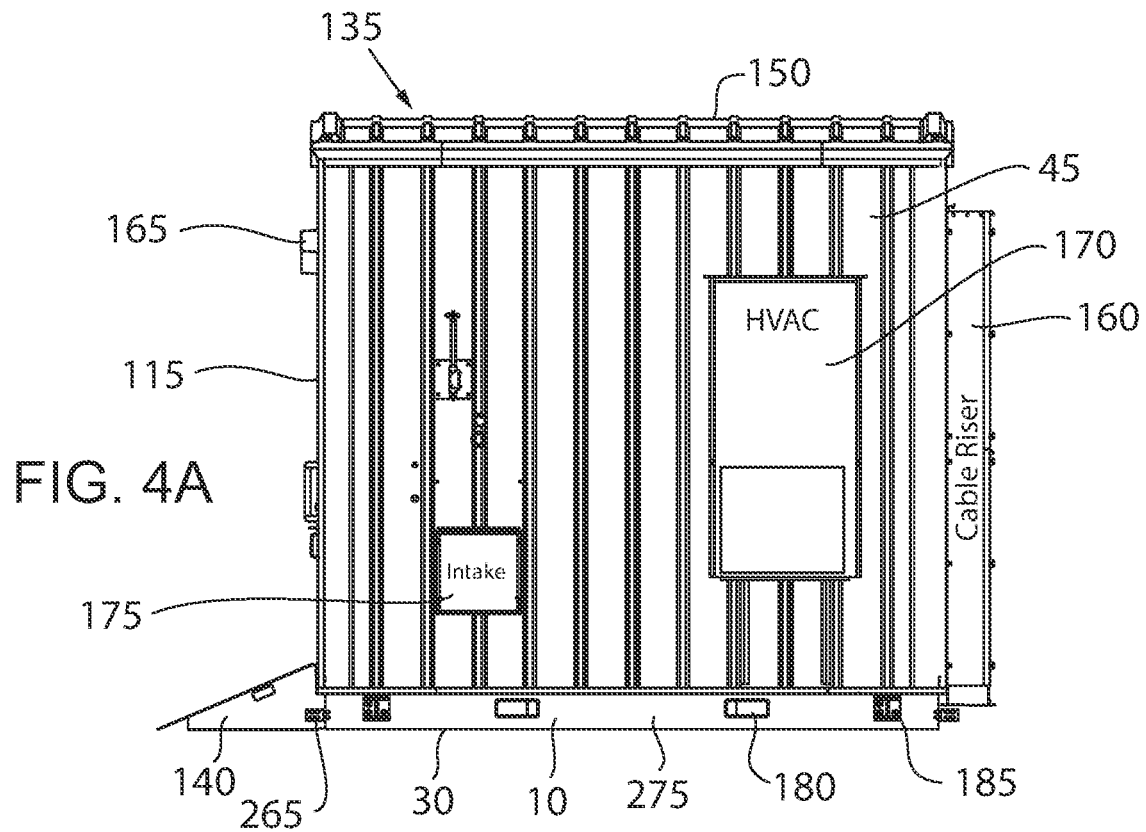
FIGS. 4A and 4B are side views of one embodiment of an EMP hardened enclosure of the present invention.

FIG. 4A illustrates a side view of one embodiment of an EMP hardened utility enclosure of the present invention. A ramp 140 contacts the support surface 25 and rises above the floor assembly 5 to lead up to the door 115. The floor assembly 5 includes floor joist members 10 and perimeter channels 275. The perimeter channel 275 contains fork pockets 180 extending through the perimeter channel 275 to allow for laying or moving of the floor assembly 5. The perimeter channel 275 also contains lifting lugs 185, to help with placement. Secured to the exterior wall panels 45 and extending through them as well as through the interior wall panels 40 (see FIG. 5) and wall framework 35 (see FIG. 5) is a cable riser 160 and a secure exhaust 190, depending on the embodiment.

Figure 4B:
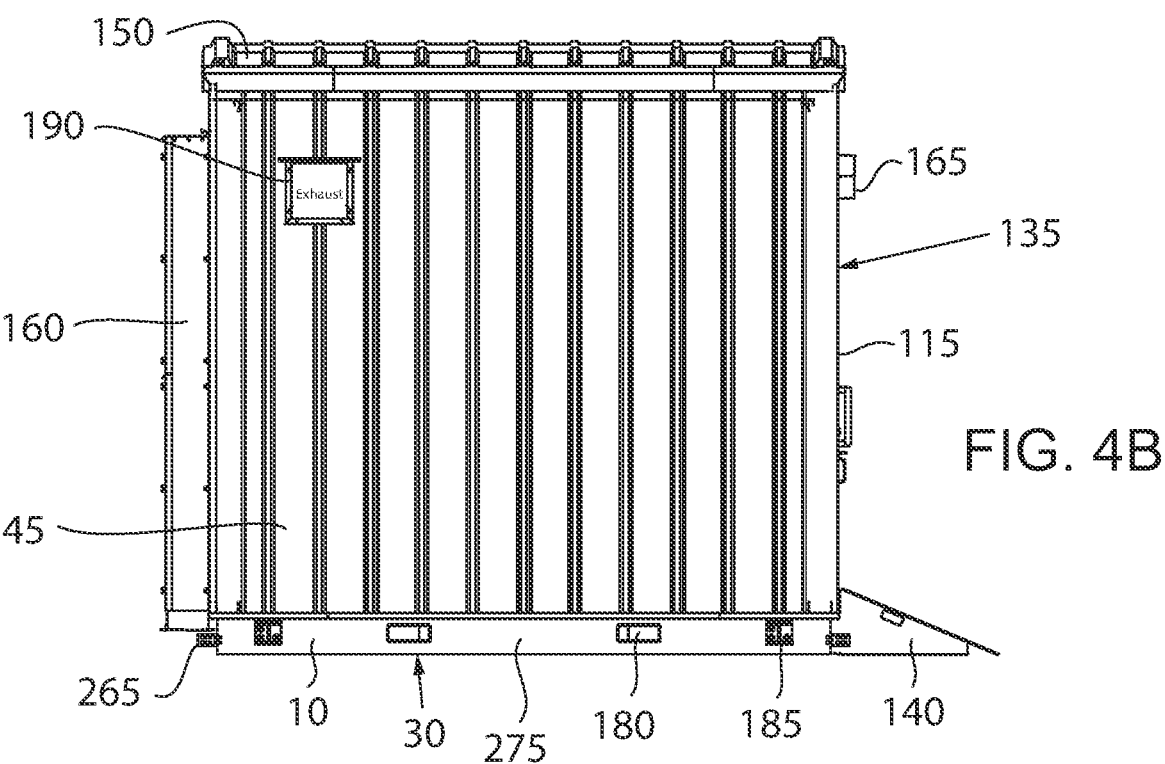

FIG. 4B illustrates another side view of one embodiment of an EMP hardened utility enclosure of the present invention. A ramp 140 contacts the support surface 25 and rises above the floor assembly 5 to lead up to the door 115. The floor assembly 5 includes floor joist members 10 and perimeter channels 275. The perimeter channel 275 contains fork pockets 180 extending through the perimeter channel 275 to allow for laying or moving of the floor assembly 5. The perimeter channel 275 also contains lifting lugs 185, to help with placement. Secured to the exterior wall panels 45 and extending through them as well as through the interior wall panels 40 (see FIG. 5) and wall framework 35 (see FIG. 5) is a cable riser 160, a secure intake 175, and an HVAC unit 170, depending on the embodiment.

Figure 5:
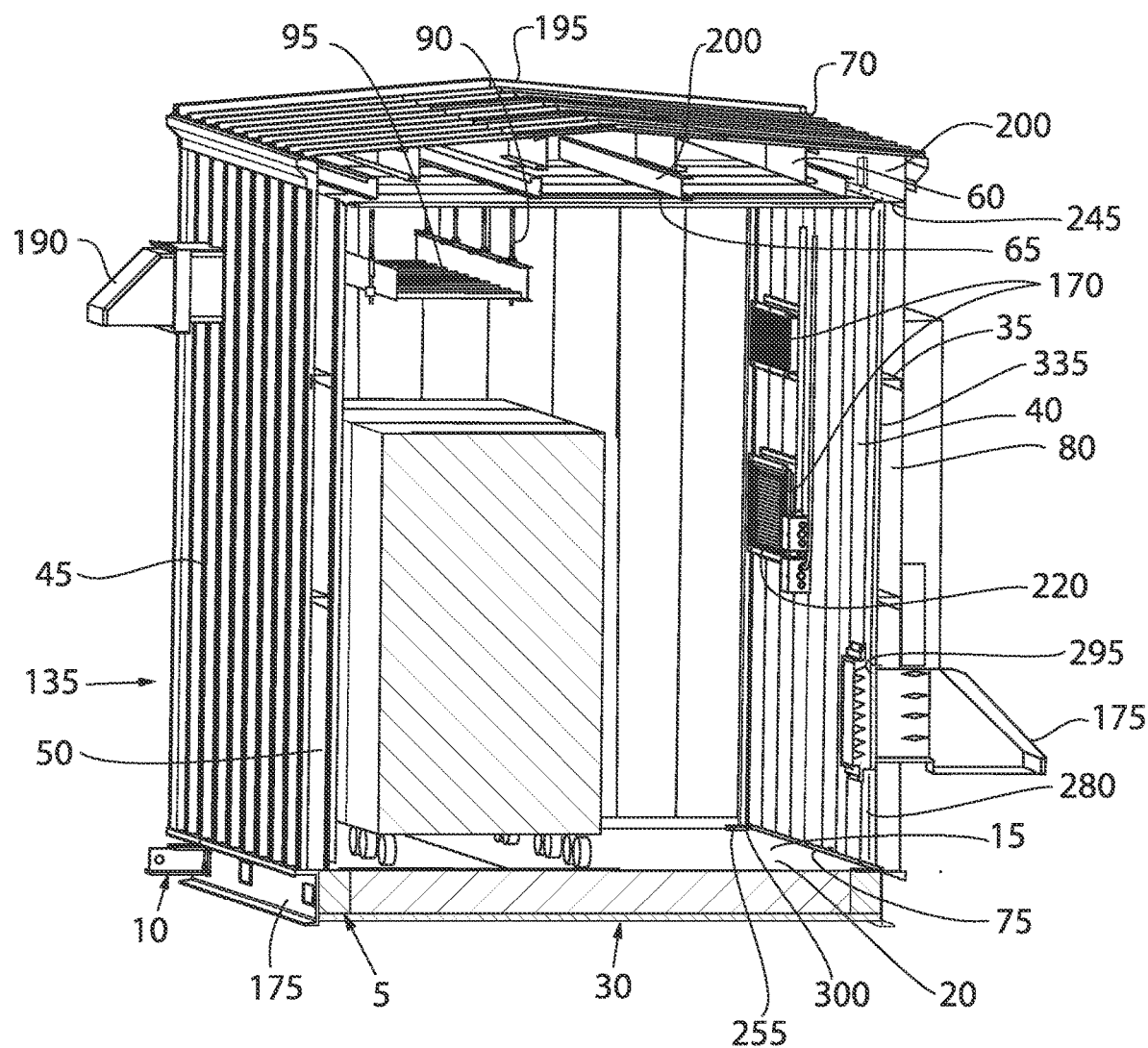
FIG. 5 is a cross-sectional perspective view of one embodiment of an EMP hardened enclosure of the present invention.

FIG. 5 illustrates a cross-sectional perspective view of one embodiment of an EMP hardened utility enclosure of the present invention. The enclosure 135 makes contact with the support surface 25 through base panels 30 that are secured to the bottom face of floor joist members 10. These floor joist members 10 and the perimeter channels 275 make up a portion of the floor assembly 5. Atop of the floor joist members 10, is at least one floor panel 20 comprising the floor 15. At the edges of the floor 15 is a continuous, conductive connection 75 connecting the floor 15 to the interior wall panels 40. Secured to an interior corner of the floor is an internal ground pad 255 that is in communication with an exterior ground pad 265 (see FIG. 8) through a continuous conductive grounding connection 300, allowing for the enclosure to be electrically grounded. The interior wall panels 40 are lined with a liner 280 and are secured to an interior portion of the wall framework 35. Secured to the exterior portion of the wall framework 35 are exterior wall panels 45. Disposed between the interior wall panels 40 and the exterior wall panels 45 is a wall insulation space 40 where insulation 155 may be placed, depending on the embodiment. Between the interior wall panels 40 and the wall framework 35, there may be a barrier 335. Depending on the embodiment, the barrier may be a 4 mil. polyethylene vapor barrier or other type of barrier depending on the requirements for the particular embodiment.

Further in FIG. 5, an air intake 175, air exhaust 190, and an HVAC unit 170 provide points of entry 55 extending through the exterior wall panels 45, the wall framework 35, and the interior wall panels 40. These points of entry 55 present an airway penetration 295 that is secured with a honeycomb vent 220 to provide shielding. Roof truss members 60 extend the length of the enclosure 135 connecting to the wall framework 35 and further secured to the wall framework 35 with fasteners 245. The wall framework 35 is secured to the interior wall panels 40 at posts 230, girts 225, strappings 215, base channels 235, and top channels 240 (see FIG. 6) using fasteners 245. The floor 15 and ceiling 145 are also secured to the wall framework 35 with fasteners 245. The floor 15, ceiling 145, and interior wall panels 40 are mechanically fastened to each other through continuous conductive connections 75 so that they are all in electrical continuity with each other, thus forming the shield layer 80. The shipping split 195 is secured through bonding of an electrical shield 205 (see FIG. 9) across the split 195. See also electrical shield an associated shield layers 403 in FIGS. 13-15, shield layers 426a, 426b in FIGS. 16-18; and shield layers 442 in FIGS. 20-22. While the shield layer or layers are not shown in every figure, it is understood that each of the enclosures has a shield layer that extends about the various illustrated enclosures to protect the contents from electromagnetic pulses. Additionally, splice bonds 200 are used to secure the ends of the shipping splits 195.

Further still in FIG. 5, a panel of ceiling members 65 is secured to the bottom portion of the roof truss members 60, comprising a ceiling. Roof panels 70 are secured to the top portion of the roof truss members 60 and make up the roof 150. In some embodiments, extending through a middle length of the roof 150 is a shipping split 195. Once the enclosure is in place, a continuous electrical shield 205 (see FIG. 9) is bonded across the shipping split 195 and at least one splice bond 200 extends across the ends of the shipping split 195. Extending downward from the ceiling 145 are mounting arms 90. The ends of the mounting arms 90 that are distal to the ceiling 145 are secured to a tray 95. A tray cover 100 is also secured to the mounting arms 90 at a location that is more proximal to the ceiling 145 that the tray 100 is secured to, creating a compartment 105 between the tray 95 and the tray cover 100, for running wires through the enclosure in a safe manner or for a variety of different purposes.

Figure 6:
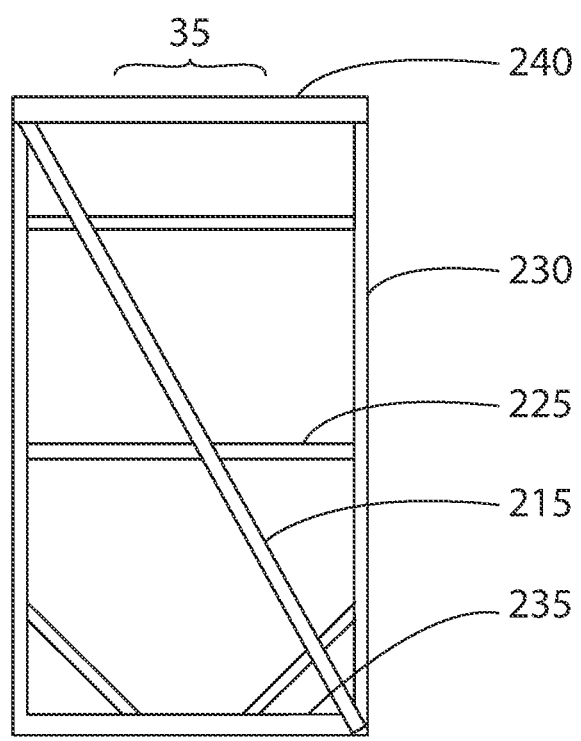
FIG. 6 is a front view of one embodiment of a wall framework of the present invention.

Shown in FIG. 6 is a front view of one embodiment of a wall framework 35 of the present invention. The wall framework 35 extends upwards from the floor assembly 5 on a first, second, third, and fourth side. The wall assembly includes a base channel 235, a strapping 215, a girt 225, a post 230, and a top channel 240. A continuous conductive connection 75 and fasteners 245 connect the wall framework 35 to the floor 15, ceiling 145, and interior wall panels 40.

Figure 7A:
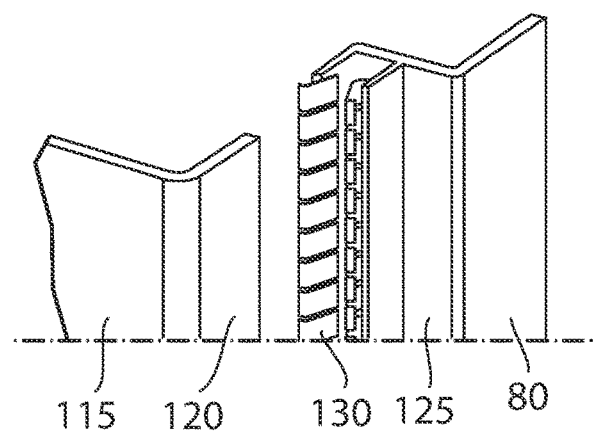
FIGS. 7A and 7B are perspective views of one embodiment of a door with a blade and a door frame of the present invention.
Figure 7B:
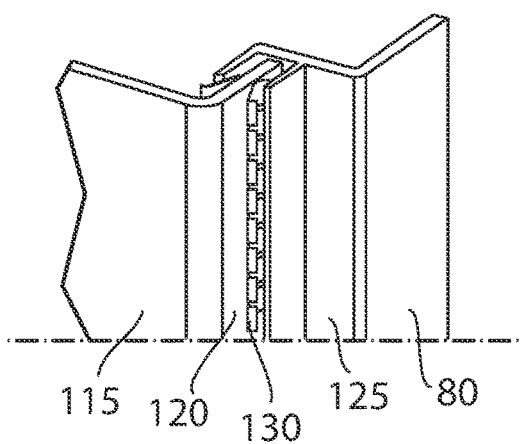

FIGS. 7A and 7B illustrate perspective views of one embodiment of a door with a blade and a door frame of the present invention. The door 115 has a blade 120 extending from its distal edge. The door frame 125 is lined with radio frequency seals of beryllium copper finger stock 130 or any other suitable conductive material, which is configured for receiving the blade 120 of the door 115. The door frame 125 is secured directly to the shield layer 80 of the enclosure 135. This configuration allows for the door 115 to serve as a secure point of entry 55 to the enclosure 135.

Figure 8:
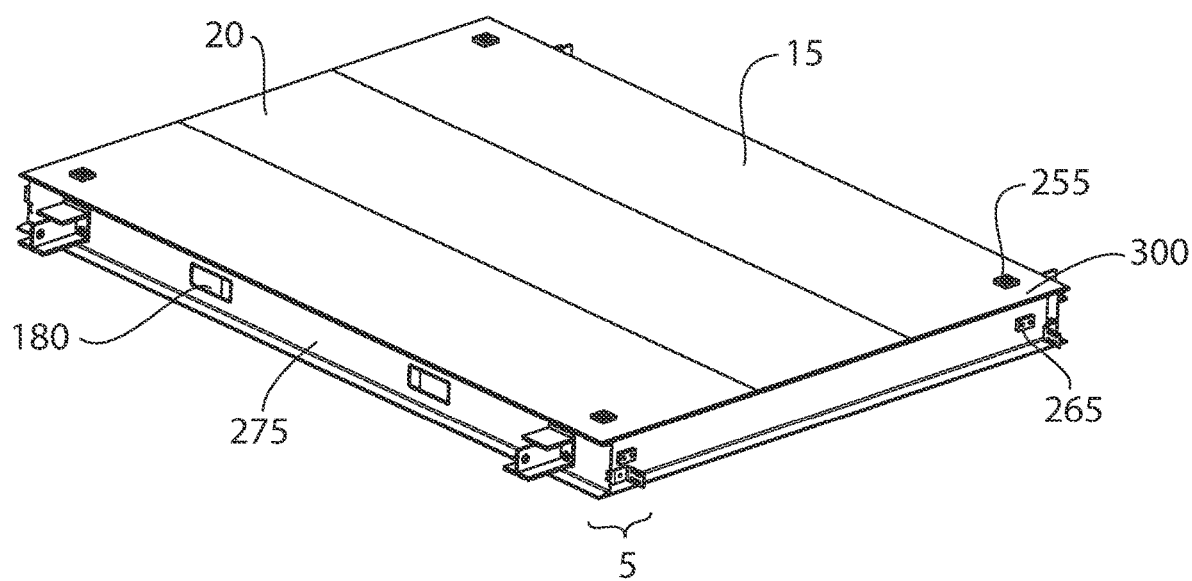
FIG. 8 is a perspective view of one embodiment of a floor assembly of the present invention.

FIG. 8 illustrates perspective view of one embodiment of the floor assembly 5 of the present invention. Perimeter channels 275 make up the outer perimeter of the floor assembly 5. Extending through the perimeter channels 275, are fork pockets 180, which allow for convenient placement and movement of the floor assembly 5. Secured to the top of the floor assembly 5 and perimeter channels 275, is at least one floor panel 20 making up the floor 15. Secured to the floor 15 is at least one interior ground pad 255. This interior ground pad 255 is in communication with an exterior ground pad 265 through a continuous conductive grounding connection 300. The continuous conductive grounding connection 300 provides a way for the enclosure to be electrically grounded.

Figure 9:
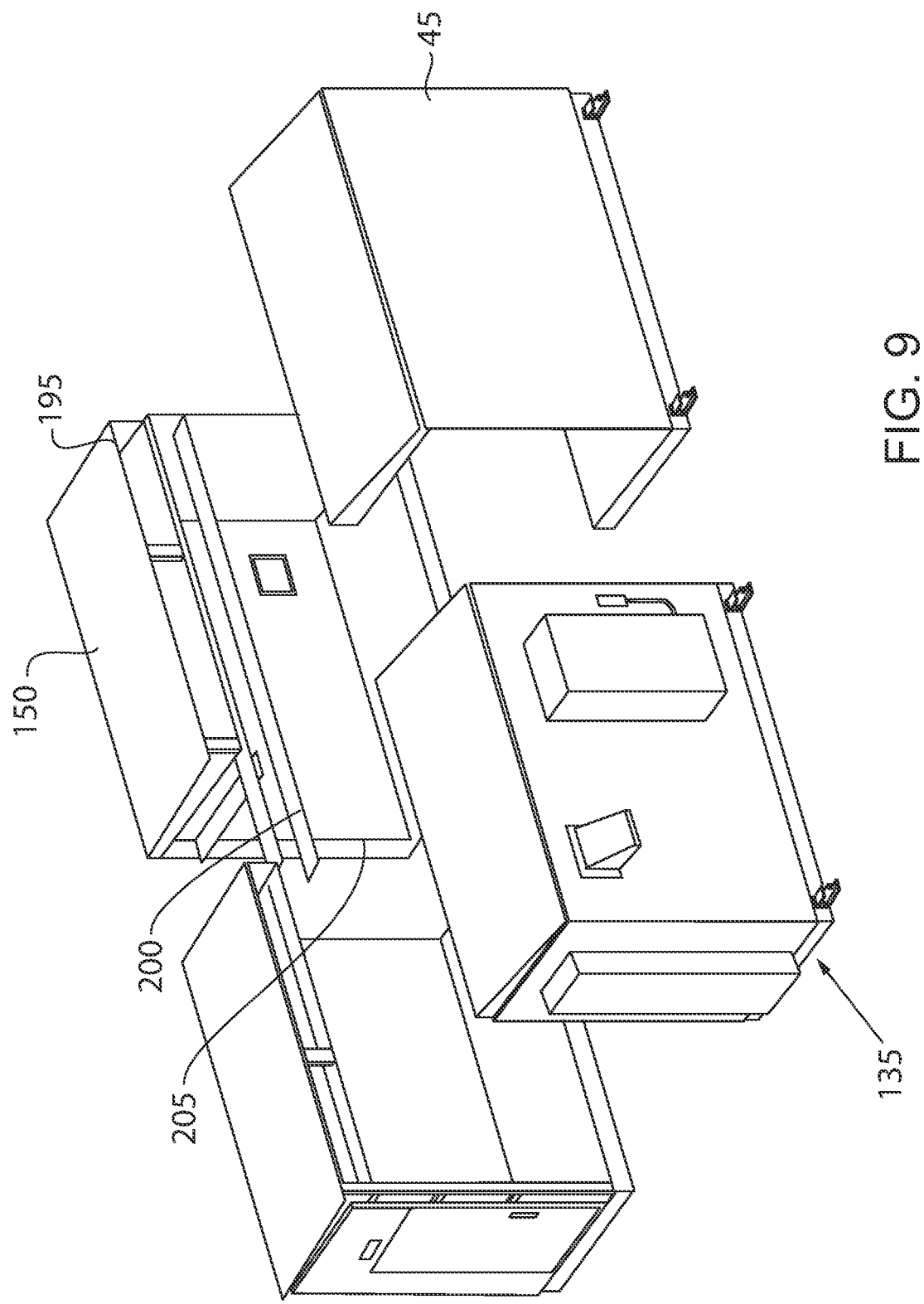
FIG. 9 shows an exploded perspective view of one embodiment of an EMP hardened enclosure of the present invention.

FIG. 9 illustrates an exploded perspective view of one embodiment of an EMP hardened utility enclosure of the present invention. Depending on the embodiment, the enclosure 135 may have shipping splits 195 extending across the entirety of the enclosure 135 to help with transportation and building of the enclosure 135. Once in place, a continuous electrical shield 205 is bonded across the splits 195 in the floor 15, interior wall panels 40, and ceiling 145 to create an electrically contiguous six-sided Faraday cage known as the shield layer 80.

Figure 10A:
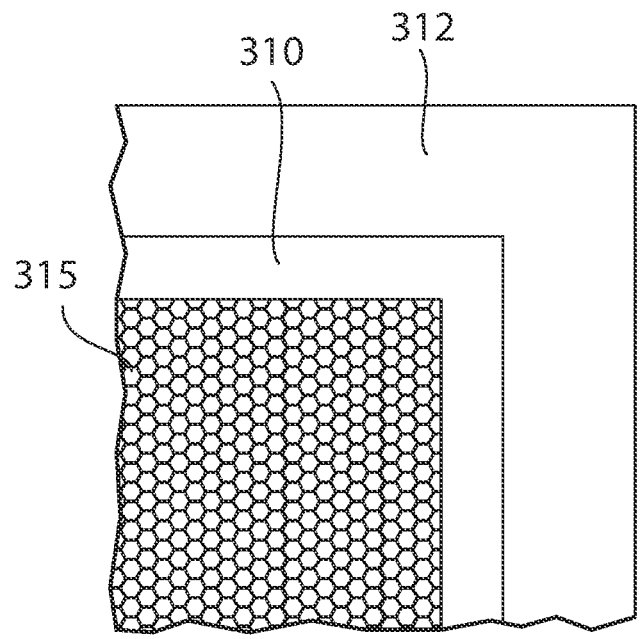
FIG. 10A is a front view of one embodiment of a honeycomb vent of the present invention.

FIG. 10A is a front view of an embodiment of a honeycomb vent 220 and associated honeycomb panel frame 312 of the present invention. Depending on the embodiment, the honeycomb vent 220 may be comprised of numerous hexagonal or other cell 315 shapes made of a conductive material and bonded to the vent frame 310. The vent frame 310 may also be made of a conductive metallic material. The honeycomb panel frame 312 is bonded to the shield layer around its entire periphery.

Figure 10B:
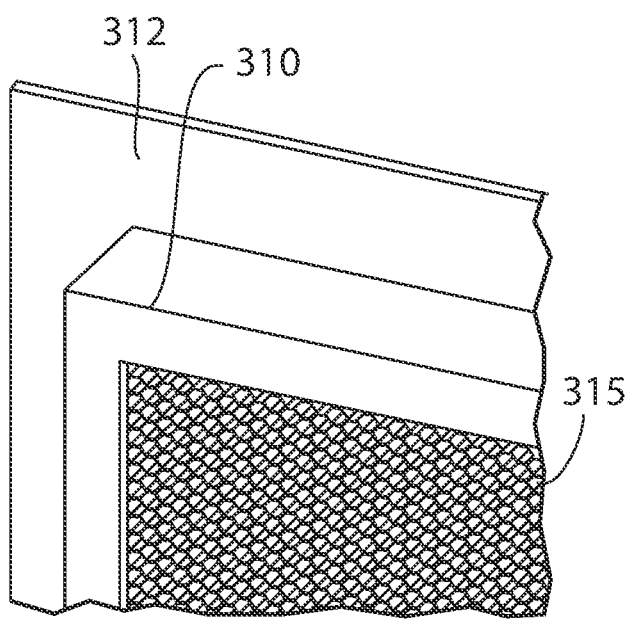
FIG. 10B is a perspective view of one embodiment of a honeycomb vent of the present invention.

FIG. 10B is a perspective view of an embodiment of a honeycomb vent 220 and associated honeycomb panel frame 312 of the present invention. Depending on the embodiment, the honeycomb vent 220 may be comprised of numerous hexagonal or other cell 315 shapes made of a conductive material and bonded to the vent frame 310. The vent frame 310 may also be made of a conductive metallic material. The honeycomb panel frame 312 is bonded to the shield layer around its entire periphery.

Figure 11:
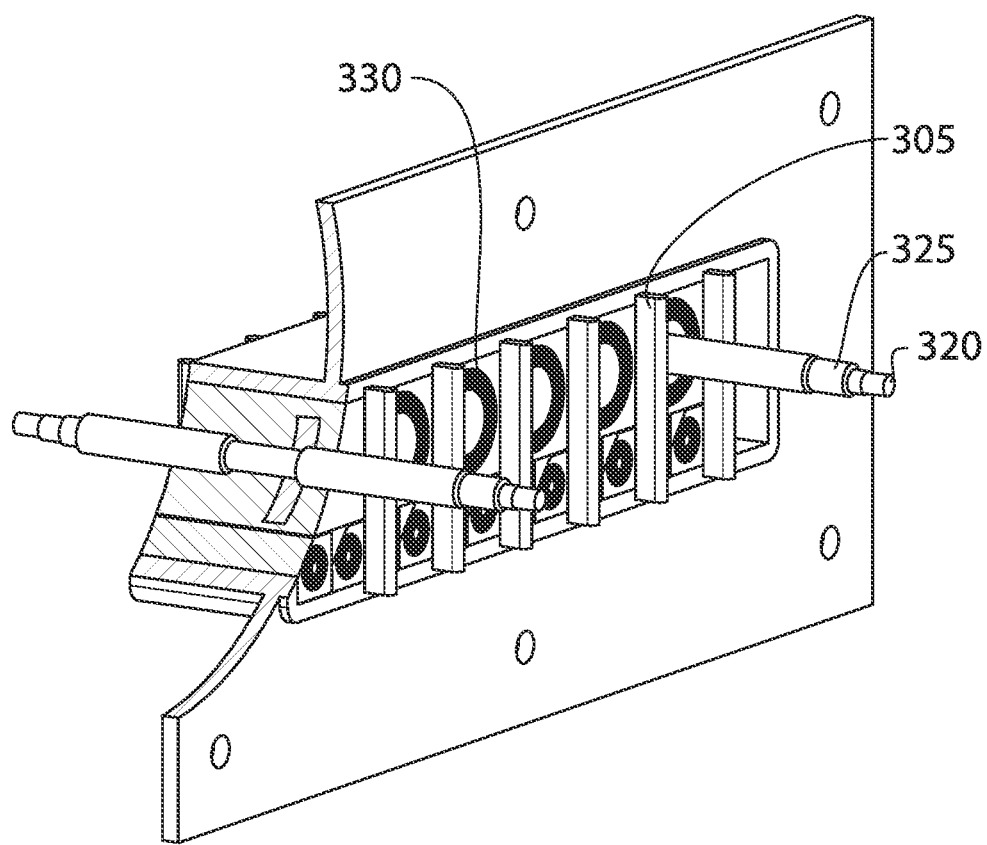
FIG. 11 is a perspective view of one embodiment of a conductor bulkhead point of entry of the present invention.

FIG. 11 illustrates a perspective view of one embodiment of a conductor bulkhead point of entry 305 of the present invention. The conductor bulkhead point of entry 305 passes cables 320 and conductors from the outside of the enclosure to the inside or vice versa. The conductor bulkhead point of entry 305 extends through the shield layer. The feedthroughs 330 of the conductor bulkhead point of entry 305 provide environmental sealing against moisture, air, dust and insect ingress; additionally, they possess features that connect the cable shields 325 on incoming cables 320 to the shield layer of the enclosure. This is one way to provide a low impedance path to direct conducted transients from cable shielding 325 directly to the building shield layer.

Figure 12:
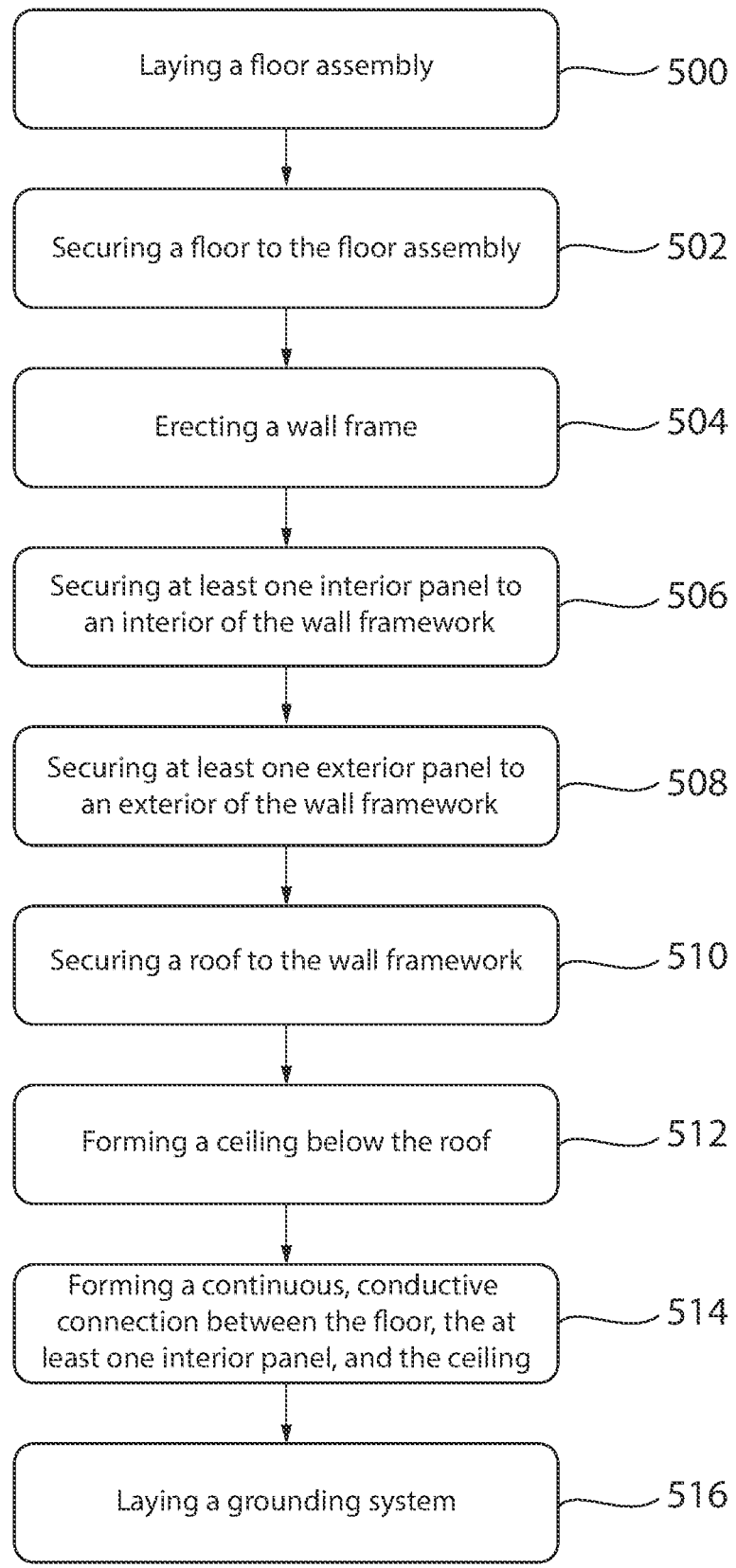
FIG. 12 is a flowchart showing the method of building the present invention.

Shown in FIG. 12 is a method of building the invention. The method begins at step #500, where a builder lays the floor assembly on a support surface. Next, at step #502, the builder secures a floor to the floor assembly. Further, at the #504, the builder erects a wall framework on a first, second, third, and fourth side of the floor assembly. Then, at step #506, the builder secures at least one interior panel to an interior of the wall framework. Next, at step #508, the builder secures at least one exterior panel to an exterior portion of the wall framework. At step #510, the builder then secures a roof to the wall framework. Then, at step #512, the builder forms a ceiling below of the roof of the enclosure. Further, at step #514, the builder forms a continuous, conductive connection between the floor, the at least one interior panel, and the ceiling. Finally, at step #516, the builder lays a grounding system to ground the enclosure. Depending on the embodiment, the enclosure may be built in a factory and later transported to its destination or, alternatively, may be built on site.

Figure 13:
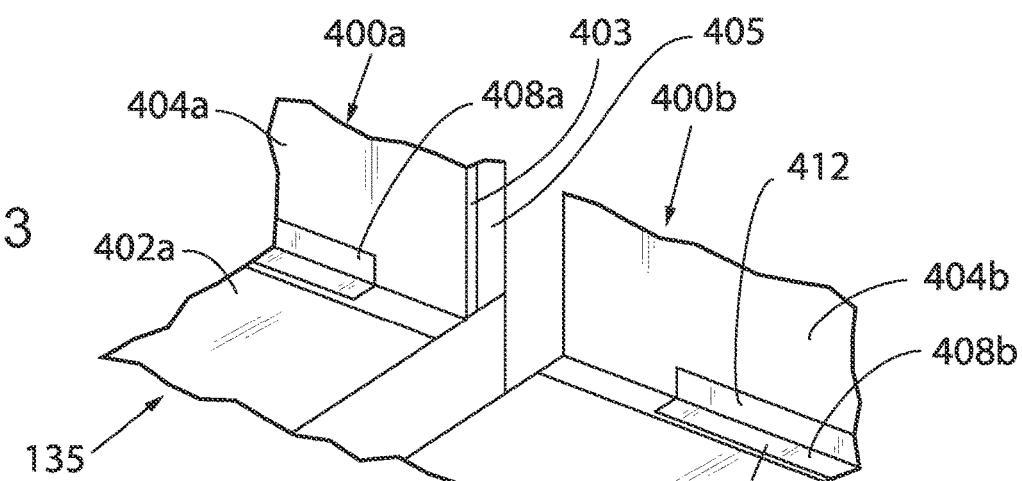
FIG. 13 is a perspective view of two adjacent enclosure sections prior to assembly.
Figure 14:
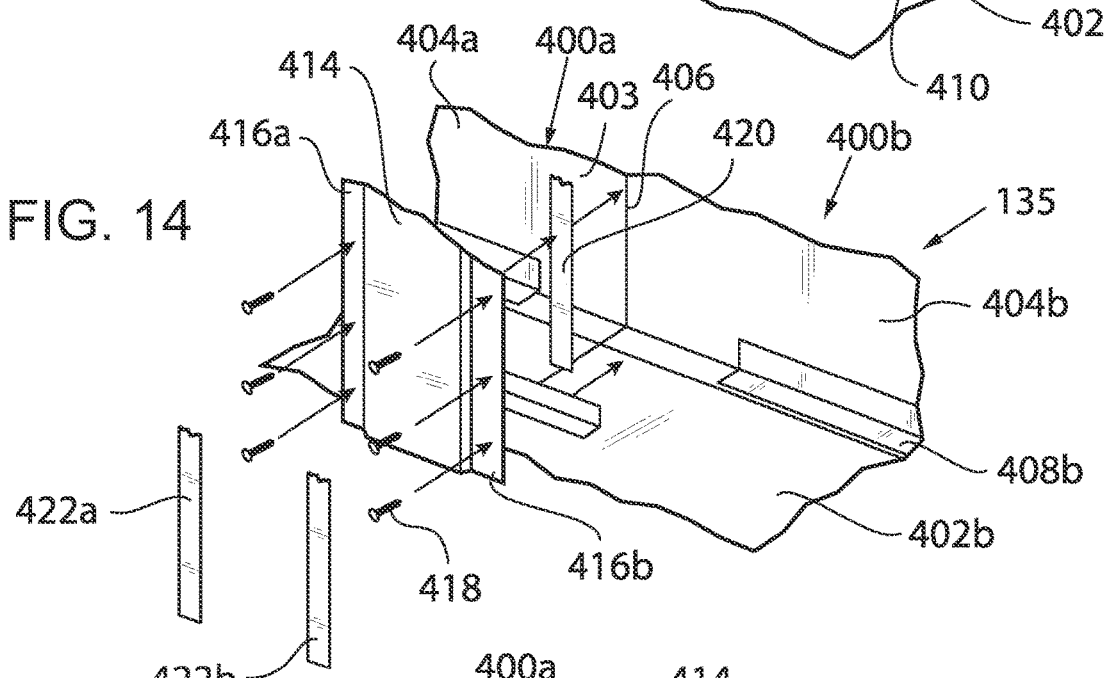
FIG. 14 is a perspective exploded view of the two adjacent enclosure sections of FIG. 13 where the sections have abutted against one another with conductive tape and a splice bond exploded from the sections.
Figure 15:
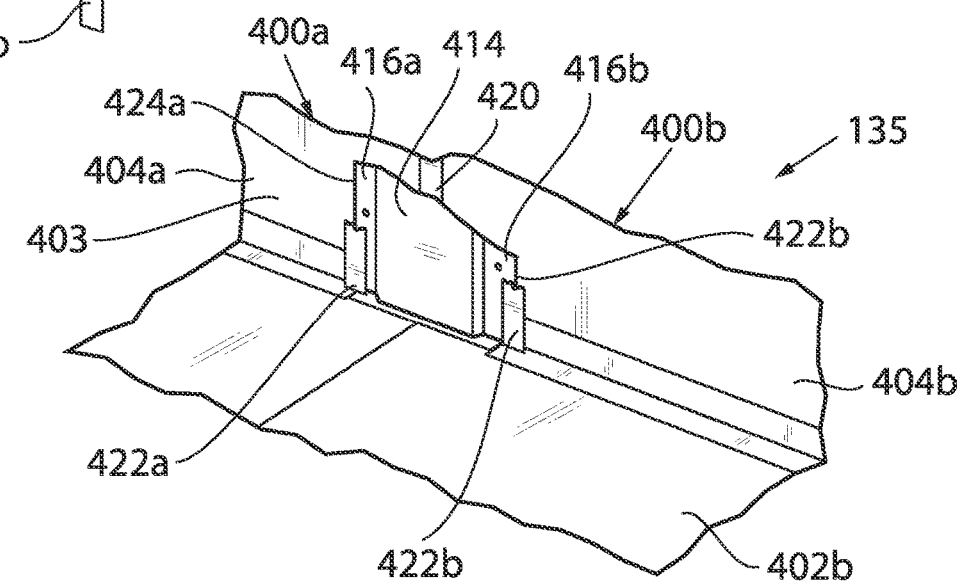
FIG. 15 is a cutaway perspective view of assembled enclosure of FIGS. 13 and 14 once the conductive tape and splice bond have been installed.

Turning next to FIGS. 13-19, additional exemplary embodiments are illustrated that highlight a number of the features described above. As discussed, in many embodiments, the enclosure 80 is shipped to a given location in multiple sections, for instance where the enclosure 80 is too large to ship in a single, assembled piece. Turning initially to FIGS. 13-15, multiple enclosure sections 400a, 400b are provided. More specifically, adjacent enclosure sections 400a, 400b include floor sections 402a, 402b and wall sections 404a, 404b. A seam 406 is located where the adjacent enclosure sections 400a, 400b abut and join one another. These figures also show bond angles 408a, 408b, which are bracket members that attach to the respective floor sections 402 at a first end 410, and to the wall sections 404 at a second end 412. For instance, the first end 410 may be two or more inches in length, and the second end 412 may be two or more inches in length. Additionally, each bond angle 408 may be approximately ten feet in length, although they could also be longer or shorter as desired. Once the sections 400a, 400b are abutted against one another as shown in FIG. 14, a conductive tape 420 is applied to the seam 406. Next, a splice bond 414 is installed over the seam 406. The illustrated splice bond 414 is a hat-shaped slice bond having landings 416a, 416b located on either side, such that the landings 416a, 416b are located on either side of the seam 406 once installed. Of course, the splice bond 414 could similarly be a flat splice bond, otherwise the splice bond could come in other shapes and configurations. Screws or other fasteners 418 secure the splice bond 414 to the wall sections 404a, 404b at the landings 416a, 416b. Once secured, additional strips of conductive tape 422a, 422b are applied at seams 424a, 424b formed between the splice bond 414 and the respective wall sections 404a, 404b.

Figure 19:
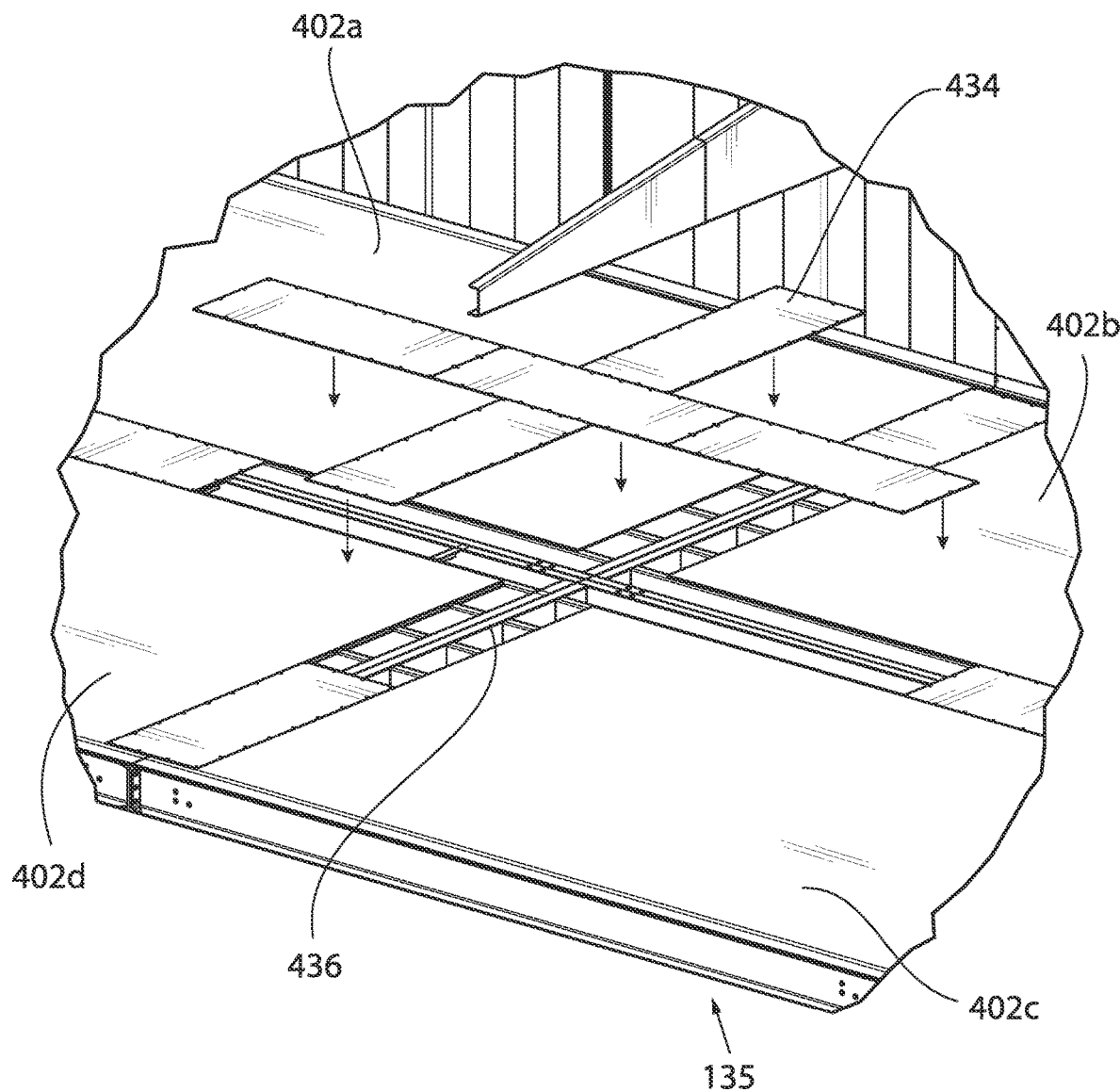
FIG. 19 is an exploded perspective view of a floor assembly with a removable deck plate.

Turning briefly to FIG. 19, another illustration is provided specifically of adjacent floor sections 402a, 402b, 402c, 402d of a quad split. Each of the floor sections 402 include copper tape that is mounted on all structural pieces, including around the perimeter of each section. A removable deck plate 434 is shown in an exploded view to further illustrate the floor sections 402. Additionally, conductive gaskets, such as TwinSeal, are provided to create electrical connection across splits formed in the floor by adjacent section 402. Seams 436 formed by the building splits are covered by the removable deck plate 434. Additional copper tape may be installed across seams on the top surface of the deck plate 434.

Figure 20:
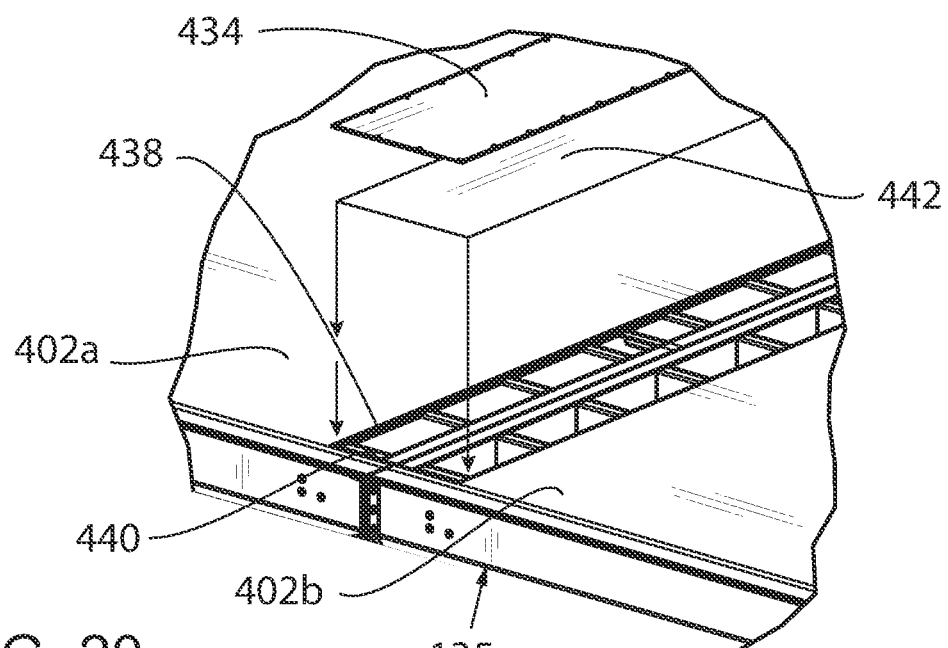
FIG. 20 is a perspective exploded view of a floor assembly with a removable deck plate and a shield layer.
Figure 21:
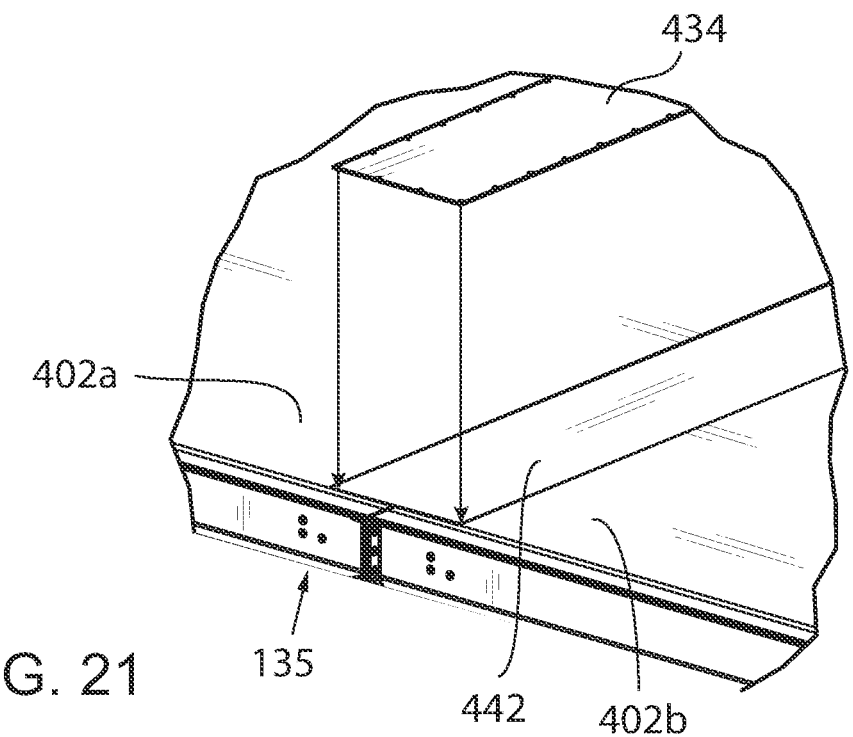
FIG. 21 is a perspective exploded view of the floor assembly of FIG. 20 with the shield layer installed onto a shelf.
Figure 22:
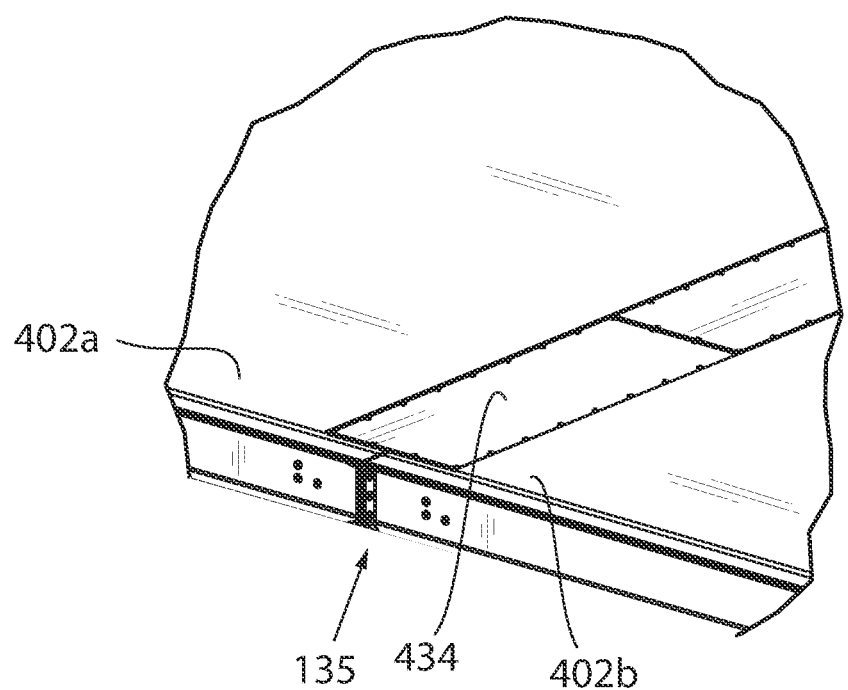
FIG. 22 is a perspective view of the floor assembly of FIGS. 21 and 22 with the deck plate installed.

Turning next to FIGS. 20-22 another embodiment is illustrated. In this embodiment, adjacent floor sections 402a, 402b are shown. The adjacent floor sections 402a, 402b are abutted against one another and a shelf 438 is formed therein. The shelf 438 may have additional conductive tape 440 extending around the perimeter of the shelf 438. Next, a shield layer 442 is installed onto the shelf 438 as shown in FIGS. 20 and 21. The shield layer 442 is dimensioned to rest on the shelf 438. Next, a deck plate 434 may be installed onto the top of the shield layer 442, as shown in FIGS. 21 and 22. The deck plate 434 may have conductive tape installed about the perimeter on the underside of the deck plate 434. Once installed, the deck plate 434 and the top surface of the floor sections 402a, 402b are substantially flush, such that a substantially level surface is provided.

Figure 16:
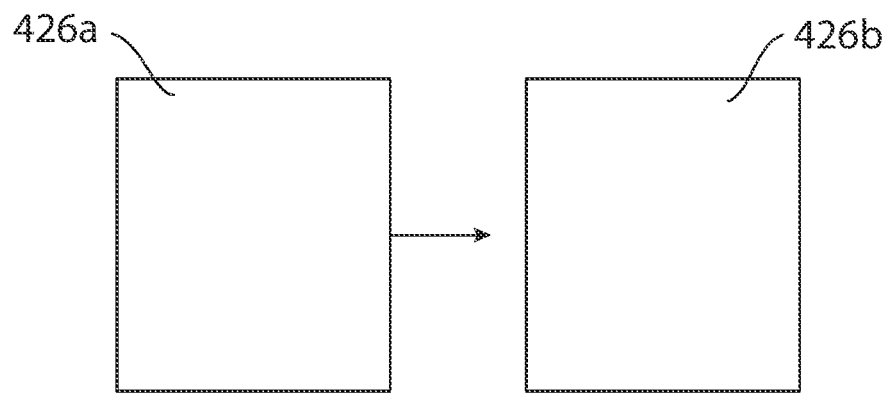
FIG. 16 is a perspective view of two adjacent shield layers prior to assembly.
Figure 17:
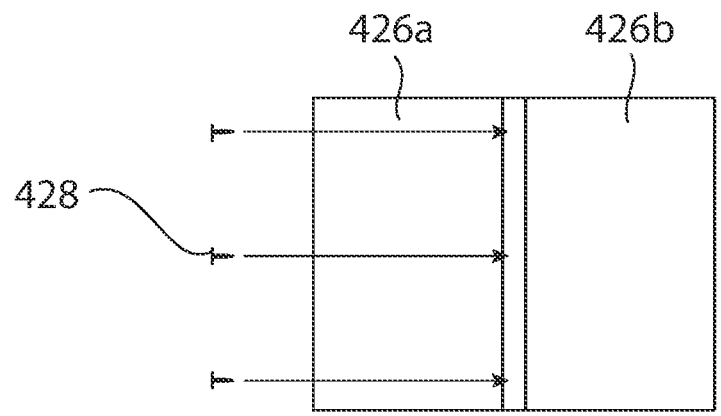
FIG. 17 is an exploded perspective view of the two adjacent shield layers of FIG. 16 once they have been overlapped but prior to securement by fasteners.
Figure 18:
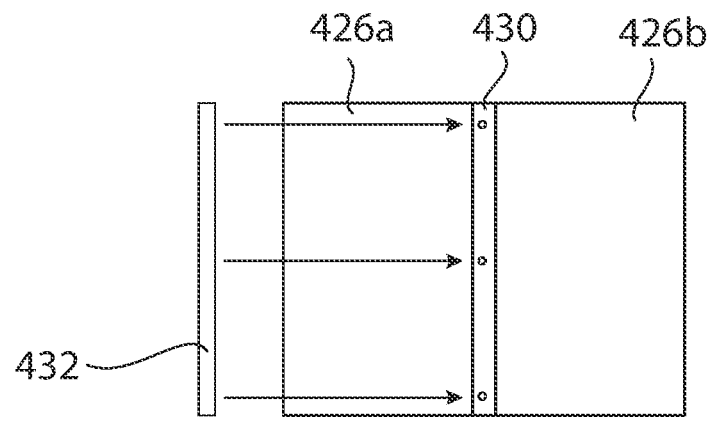
FIG. 18 is an exploded perspective view of the two adjacent shield layers of FIGS. 16 and 17 where the conductive tape is installed.

Turning briefly to FIGS. 16-18, additional exemplary figures are provided that show adjacent shield layers 426a, 426b. Shield layers 426 are typically transported in sheets and then installed to the interior surface of various enclosure framework. For instance, shield layers may be transported in four foot by ten foot sheets, such that any enclosure will require the installation of a large number of sheets of shield layers 426. Preferably, the shield layer 426 is made of 26 gauge galvalume steel, although other materials could be used as desired. Generally speaking, the thicker the material the better; and other metals could be used such as galvanized steel. Initially, the shield layers 426a, 426b are overlapped. Preferably, the overlap between the adjacent shield layers 426a, 426b is at least two inches, if not more. Next, the shield layers 426a, 426b are secured to one another using various fasteners 428, including but not limited to screws, rivets, or other mechanical fasteners. Preferably, the fasteners 428 are applied at an interval of every six inches or less. Next, the seam 430 formed between the layers 426a, 426b is prepared by scrubbing either side of the seam 430 with an abrasive material, for instance Scotch-brite pads, steel wool, or other similar media, which remove oxidization and other non-conductive contaminants. Next, the scrubbed area is cleaned using a cleaning solution, such as isopropyl alcohol or other suitable solvents. Next, as seen in FIG. 18, a continuous strip of copper foil tape 432 is applied to the seam 430. After that, the tape 432 can be burnished in place to ensure maximum adhesive and electrical contact.

Additional features of the present invention will briefly be described. Removable Deck Plates at splits are thinner to accommodate conductive gaskets, and thus can be made longer, up to five or six feet long. This helps reduce the number of seams between plates, and improves shield performance.

For interior channelframe connections, construction rivets are preferred rather than standard screws. This is to maintain maximum flatness for the shield layer, reducing bubbles and buckling.

EMP doors also always require a door support plate. This is to help protect the door from distortion during handling and transport.

For ceiling supports, construction rivets are preferably used on the undersides, just as is done for the walls, to help keep the shield layer flat. Just like the walls, the ceiling shield must pass uninterrupted over any interior partition walls.

After installing the door, use Scotchbrite and alcohol, and apply continuous strips of 1" copper foil tape along door jamb and header, bonding the door frame to the wall shield layer.

Cable Transits are a preferred method of hardening conductor POEs. The interior side of the cable transit adapter plate needs a ground connection point.

A short ~12" piece of two inch by two inch bond angle is installed at the top and bottom of any partition walls that intersect exterior walls. Bond angles must create a continuous loop around the entire building exterior walls at the floor and ceiling. The EMP shield must be continuous and should not be interrupted for interior partition walls. Conductive paste is applied to the back side of feedthrough flange where it will bond to the shield layer. This enhances conductivity and discourages corrosion. Conductive paste is applied to threads on all caps, plugs and nipples for test ports. This will prevent corrosion of the threads, and enhance conductivity.

Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept.

Moreover, the individual components need not be formed in the disclosed shapes, or assembled in the disclosed configuration, but could be provided in virtually any shape, and assembled in virtually any configuration. Furthermore, all the disclosed features of each disclosed embodiment can be combined with, or substituted for, the disclosed features of every other disclosed embodiment except where such features are mutually exclusive.

What is claimed is:

1. A modular electromagnetic pulse hardened enclosure comprising:
   a floor assembly;
   a plurality of walls secured to the floor assembly;
   a ceiling secured to the plurality of walls;
   at least one secure point-of-entry extending through the plurality of walls; and
   an interior shield layer defining a continuous, conductive connection extending between the floor assembly, the plurality of walls, and the ceiling, the shield layer including:
     a first shield layer sheet forming a wall portion of the shield layer;
     a second shield layer sheet forming a floor portion of the shield layer; and
     a L-shaped bond angle conductively connecting the wall portion of the shield layer to the floor portion of the shield layer, the bond angle being at least partially secured to the wall portion of the shield layer via conductive tape having a conductive adhesive.

2. The modular electromagnetic pulse hardened enclosure of claim 1, wherein the shield layer is made from 26 gauge galvalume steel sheets.

3. The modular electromagnetic pulse hardened enclosure of claim 2, wherein the bond angle includes a first portion and a second portion extending perpendicularly from the first portion to form an L-shape, and wherein the first portion of the bond angle is at least partially secured to the wall portion of the shield layer via conductive tape having a conductive adhesive.

4. The modular electromagnetic pulse hardened enclosure of claim 3, wherein the second portion of the bond angle is at least partially secured to the floor portion of the shield layer via conductive tape having a conductive adhesive.

5. The modular electromagnetic pulse hardened enclosure of claim 4, further comprising:
   a piece of conductive masking tape (CMT) applied between the floor portion of the shield layer and the second portion of the bond angle.

6. The modular electromagnetic pulse hardened enclosure of claim 1, wherein the bond angle bridges a gap formed between the floor portion of the shield layer and the wall portion of the shield layer to form a continuous, conductive connection between the wall portion of the shield layer and the floor portion of the shield layer.

7. The modular electromagnetic pulse hardened enclosure of claim 1, further comprising:
   a third shield layer sheet forming a ceiling portion of the shield layer; and
   a second L-shaped bond angle conductively connecting the wall portion of the shield layer to the ceiling portion of the shield layer.

8. The modular electromagnetic pulse hardened enclosure of claim 1, wherein the floor assembly includes:
   a first floor panel with a first exterior surface; and
   a second floor panel with a second exterior surface, the second floor panel abutting the first floor panel to form a shelf recessed below the first exterior surface and the second exterior surface.

9. The modular electromagnetic pulse hardened enclosure of claim 8, further comprising:
   a piece of conductive tape applied to the shelf; and the second shield layer sheet forming the floor portion of the shield layer arranged within the shelf, with the conductive tape between the shelf and the second shield layer sheet.

10. The modular electromagnetic pulse hardened enclosure of claim 9, further comprising:
a deck plate arranged within the shelf, the deck plate arranged over the second shield layer sheet, with an exterior surface of the deck plate aligned flush with the first exterior surface of the first floor panel and the second exterior surface of the second floor panel.

11. The modular electromagnetic pulse hardened enclosure of claim 10, wherein a piece of conductive tape is applied to the deck plate, between the second shield layer sheet and the deck plate.

12. An electromagnetic pulse hardened enclosure, comprising:
one or more first shield layer sheets forming a wall portion a shield layer, the first shield layer sheets secured to one or more walls of the enclosure;
one or more second shield layer sheets forming a floor portion of the shield layer, the second shield layer sheets secured to a floor of the enclosure; and
a bond angle conductively connecting the wall portion of the shield layer to the floor portion of the shield layer, the bond angle including:
a first portion at least partially secured to the wall portion of the shield layer via conductive tape having a conductive adhesive; and
a second portion extending from the first portion to form an L-shape, the second portion at least partially secured to the floor portion of the shield layer via conductive tape having a conductive adhesive.

13. The electromagnetic pulse hardened enclosure of claim 12, further comprising:
one or more third shield layer sheets forming a ceiling portion of the shield layer, the third shield layer sheets secured to a ceiling of the enclosure; and
a second L-shaped bond angle conductively connecting the wall portion of the shield layer to the ceiling portion of the shield layer.

14. The electromagnetic pulse hardened enclosure of claim 12, further comprising:
a piece of conductive masking tape (CMT) applied between the floor portion of the shield layer and the second portion of the bond angle.

15. The electromagnetic pulse hardened enclosure of claim 12, wherein the floor of the enclosure includes:
a first floor panel with a first exterior surface; and
a second floor panel with a second exterior surface, the second floor panel abutting the first floor panel to form a shelf recessed below the first exterior surface and the second exterior surface.

16. The electromagnetic pulse hardened enclosure of claim 15, further comprising:
a piece of conductive tape applied to the shelf; and
one of the second shield layer sheets forming the floor portion of the shield layer arranged within the shelf, with the conductive tape between the shelf and the second shield layer sheet.

17. The electromagnetic pulse hardened enclosure of claim 16, further comprising:
a deck plate arranged within the shelf, the deck plate arranged over the second shield layer sheet, with an exterior surface of the deck plate aligned flush with the first exterior surface of the first floor panel and the second exterior surface of the second floor panel.

18. The electromagnetic pulse hardened enclosure of claim 17, wherein a piece of conductive tape is applied to the deck plate, between the second shield layer sheet and the deck plate.

19. The electromagnetic pulse hardened enclosure of claim 12, wherein the one or more first shield layer sheets forming the wall portion a shield layer are at least partially overlapped to form a double-thick portion of the shield layer, and wherein one or more fasteners are arranged through the double-thick portion of the shield layer to secure the one or more first shield layer sheets together.

20. The electromagnetic pulse hardened enclosure of claim 19, wherein the overlap between the one or more first shield layer sheets forming the wall portion of the shield layer creates a seam between the first shield layer sheets, and wherein a piece of conductive tape having conductive adhesive is applied to the seam to conductively connect the one or more first shield layer sheets.

\* \* \* \* \*